United States Patent [19]
Herold et al.

[11] 3,986,201
[45] Oct. 12, 1976

[54] HIGH OUTPUT WAFER-SHAPED SEMICONDUCTOR COMPONENT WITH PLASTIC COATING

[75] Inventors: Ludwig Herold, Warstein; Wolfgang Pikorz, Belecke; Alois Sonntag, Mulheim, all of Germany

[73] Assignee: Licentia Patent-Verwaltungs-G.m.b.H., Frankfurt am Main, Germany

[22] Filed: Dec. 24, 1974

[21] Appl. No.: 536,211

[30] Foreign Application Priority Data
Dec. 27, 1973 Germany............................ 2364728

[52] U.S. Cl.................................... 357/79; 357/72; 357/74; 357/81
[51] Int. Cl.².................. H01L 23/28; H01L 23/02; H01L 23/42; H01L 23/44
[58] Field of Search................. 357/72, 74, 79, 80, 357/81

[56] References Cited
UNITED STATES PATENTS

| | | | |
|---|---|---|---|
| 3,443,168 | 5/1969 | Camp et al. | 357/79 |
| 3,559,001 | 1/1971 | Cooper et al. | 357/79 |
| 3,831,067 | 8/1974 | Wislocky et al. | 357/81 |

FOREIGN PATENTS OR APPLICATIONS

| | | | |
|---|---|---|---|
| 1,544,424 | 9/1968 | France | 357/79 |

Primary Examiner—Andrew J. James
Attorney, Agent, or Firm—Spencer & Kaye

[57] ABSTRACT

A high output semiconductor device of the type which is tightly encased in a plastic coating, and includes a wafer-shaped semiconductor body having electrodes at its opposed major surfaces, two cylindrical metal bodies serving as current connecting and heat dissipating members contacting the electrodes of the semiconductor body at the respective major surfaces, and an insulating ring which encloses the metal bodies and the semiconductor body thereby centering the same. A pair of annular sheet metal strips, each having a dished portion adjacent the inner periphery, are each fastened at their inner peripheries to the superficies of a respective one of the two metal bodies. The dished portion of each of the annular strips encloses one frontal face or edge surface of the insulating ring while leaving an air gap therebetween and the outer edge portion of each annular strip extends into and is rigidly embedded in the plastic coating which has been produced by encasing or spraying under pressure around the outer surface of the insulating ring. The insulating ring is made of a material which does not adhere to the metal bodies or the annular strips and has a high softening temperature.

6 Claims, 2 Drawing Figures

HIGH OUTPUT WAFER-SHAPED SEMICONDUCTOR COMPONENT WITH PLASTIC COATING

BACKGROUND OF THE INVENTION

The present invention relates to a high output wafer-shaped semiconductor device which is tightly sealed by a plastic coating. More particularly the present invention relates to such a semiconductor device including a wafer-shaped semiconductor body provided with major electrodes at its two opposed major surfaces, two cylindrical metal bodies, serving as current connecting means and heat dissipating means, contacting the semiconductor body at its respective major electrodes, and a ring of insulating material which encloses and centers the metal bodies and the semiconductor body.

Wafer-shaped semiconductor devices of the above type are commercially available. The insulating ring in these components is generally made of plastic or ceramic. Insulating parts of plastic, e.g. a type of silicone, can be manufactured less expensively than insulating parts of ceramic so that plastic parts are preferred. It has been found, however, particularly with high output semiconductor components which are to be embedded in plastic, that it is extremely difficult to shape and structure the plastic parts of the semiconductor device in such a way that the plastic embedding mass provides a seal which is resistant against the influences of alternating thermal stresses. Alternating stresses produce internal mechanical stresses in a device of the above-described type due to the different coefficients of thermal expansion of the metal bodies which contact the semiconductor body on the one hand, and the plastics employed for encasing the device and for the insulating ring, which stresses may lead to the formation of cracks in the plastic parts.

SUMMARY OF THE INVENTION

It is the object of the present invention to provide a semiconductor device of the above-described type with an insulating ring of plastic so that the plastic coating encasing the device provides a seal which is completely resistant against alternating thermal stresses.

This is accomplished according to the present invention by providing a semiconductor device of the above described type with a pair of annular sheet metal strips which are each provided with a dished portion adjacent their inner peripheries and whose inner peripheries are fastened to the outer surface of a respective one of the two metal bodies which contact the semiconductor body. The dished portion of each strip covers a respective frontal face or end surface of the insulating ring which is made of a plastic material which will not adhere to the metal bodies or the annular strips and which has a high softening temperature, so as to leave a frontal air gap therebetween. The outer edge of each of the strips extends into the plastic coating which has been provided by encasing or spraying under pressure around the outer surface of the insulating ring and is firmly embedded in the plastic coating.

With this arrangement a total of two dished annular sheet metal strips are fastened to the respective outer surfaces of the two cylindrical metal bodies and these two strips cover the two frontal faces of the insulating ring without contacting the frontal surfaces so that they are protected. These sheet metal strips not only prevent the liquid plastic material, which is used during the encasing or spraying process of the semiconductor body, the metal bodies and the insulating ring to produce the plastic coating, from coming in contact with the semiconductor body, but they also form stretchable elastic members when the completed plastic coating has hardened, which members are firmly embedded in the coating and are permanently connected to the metal bodies. The two annular air gaps between the frontal faces of the insulating ring and the metal strips provide sufficient play for deformations of the dished portions or sheet metal beads so that deformations of the insulating ring occurring during alternating stresses in the semiconductor device can be compensated without tension with respect to the metal bodies. If the components of the device are compressed, the insulating ring will be deformed with respect to the metal bodies and this deformation will be accommodated by the metal strips.

If it is desired, under certain circumstances, to further increase the elastic stretchability of the dished annular metal strips, these strips can be designed, according to a further feature of the invention, in the form of a bellows.

It is further significant that those parts of the inner and outer surfaces of the insulating ring and the parts of the metal bodies contacting these surfaces as well as the annular metal strips must not stick together or adhere when the semiconductor device is encased in the hot liquid plastic so that the play area for the dished portions of the metal strips is reduced in size. To prevent this, a further feature of the invention provides that the insulating rings of the semiconductor device of the above-described type is made of a glass fiber reinforced epoxy mass.

DESCRIPTION OF THE PREFERRED EMBODIMENTS

Figure 1:
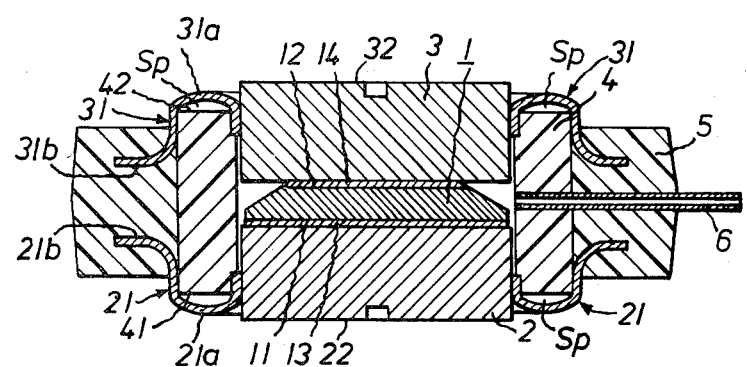
FIG. 1 is a cross-sectional view of a thyristor type semiconductor device constructed according to the invention.
Figure 2:
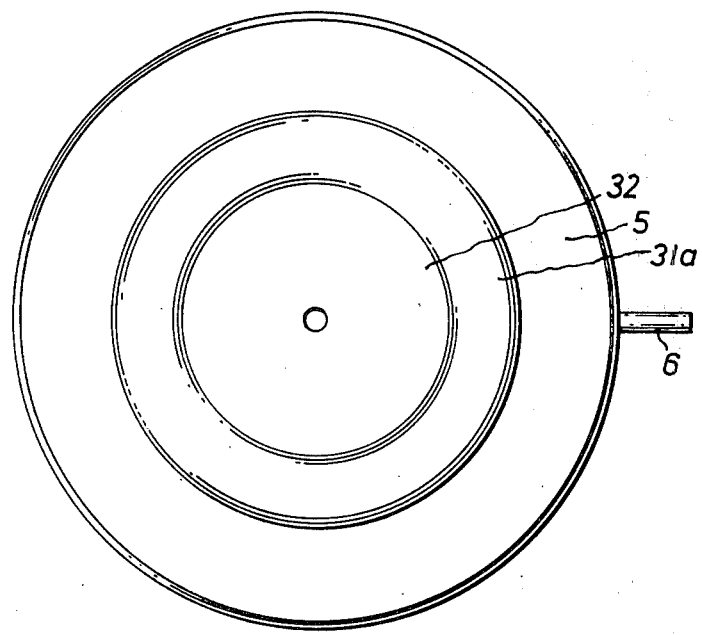
FIG. 2 is a plan view of the thyristor device of FIG. 1.

Referring now to FIGS. 1 and 2, there is shown a thyristor device according to the present invention which includes a wafer-type semiconductor body 1, which is a thyristor, having major electrodes 13, 14 attached to the two opposite major surfaces 11 and 12 of the wafer and a control electrode (not shown) attached to the major surface 12 and two cylindrical metal bodies 2 and 3 of solid copper and an insulating ring 4. The thyristor semiconductor body 1 is disposed between the two metal bodies 2 and 3 with its major electrode 13 areally contacting the metal body 2 and its major electrode 14 areally contacting the metal body 3. In such an arrangement the thyristor element 1 and the two metal bodies are held in a centered arrangement in the insulating ring 4. The insulating ring 4 is made of a plastic, e.g. of a glass fiber reinforced epoxy mass.

In a special embodiment of the invention the insulating ring 4 is made of a ceramic material. No care is required for using such a material since, at (medially) elevated temperatures, the insulating ring 4 and the metal bodies 2 and 3 do not tend to adhere together.

According to the invention, the softening temperature of a plastic material for the insulating ring 4, i.e., the temperature above which the substances of the insulating ring and of the metal bodies tend to stick together and adhere, is higher than the temperature at which the plastic materials used for encasing the device become liquid.

The metal bodies 2 and 3 of copper serve as the so-called current taps of the device. At the superficies of each cylindrical metal body 2 and 3 a bead-like annular sheet metal strip 21 or 31, respectively, also of copper, is hard soldered. Each of these annular bead-like strips 21 and 31 has a bead or a dished portion 21a and 31a, respectively, adjacent the inner periphery thereof which encloses the associated metal body 2 or 3 respectively and which at its outer edge 21b or 31b, respectively, is provided with an extension. The beads or dished portions 21a and 31a encloses the frontal faces or edge surfaces 41 and 42 of the insulating ring 4, leaving an air gap Sp of about 1 millimeter in width between the respective frontal faces and the inner surface of the dished portions.

The thyristor device thus far described is encased in a tightly sealing peripheral plastic coating 5, but only to the extent that the free major surfaces 22, 32 of the cylindrical metal bodies 2 and 3 and the two beads or dished portions 21a and 31a extend on both sides of the coating 5 so that the major surfaces can be contacted. In order to apply the coating 5 around the device, the device is placed into a press mold and is encased under high pressure at approximately 150° C in a liquid plastic, e.g. an epoxy resin or a silicone pressing mass which has been introduced into the press mold. The coating 5 is made of a pressed material such as epoxy resin or pheno and amino or a diallyle phthalate cast mass, or furthermore a polyester resin or a silicone resin. These pressed materials may be filled out with additional materials such as mineral powders or glass fibers. The device can also be encased in a press mold by spraying in a liquid plastic which is pressed through an extruder. The pressure on the free major surfaces 22, 32 is maintained until the plastic mass has cooled. Thus during these processing steps it is not possible for the liquid plastic to contact the semiconductor body 1 disposed between the metal bodies 2 and 3 because ring 4 prevents penetration of the plastic. In the same way, the plastic mass forming the coating 5 can also not enter into air gaps Sp.

In the finished device these air gaps Sp are free, while the outer edges 21b and 31b, respectively, of the annular metal strips 21 and 32 are firmly embedded in the hardened plastic coating 5. A thyristor device provided in this manner can be exposed to continuous alternating thermal stresses. If different deformations of these components are produced as a result of the different coefficients of thermal expansion of the metal bodies 2 and 3 and the plastic material of the insulating ring 4, the air gaps Sp provide sufficient play for the metal strips 21 and 31 to provide a compensating deformation. Also, as described above the plastic material for the insulating ring 4 has been selected so that during encasing or covering of the device with a hot liquid plastic, the material of the ring 4 will not stick or adhere to the metal bodies 2 and 3 and to the metal strips 21 and 31 so that when the insulating ring 4 is subsequently deformed as a result of alternating stresses it can slide without adhesion over the metal bodies 2 and 3 and over the annular metal strips 21 and 31. This measure and these features accomplish that during alternating stresses on the device the plastic coating 5 is not exposed to mechanical stresses and will not warp. No cracks can occur in the connecting surfaces between coating 5 and the remaining components of the device and the sealing effect of the coating is not adversely influenced.

As shown in the figures, the insulating ring 4 is provided with a bore for accommodating a tube 6 through which a connecting lead to the control electrode of the semiconductor body 1 is passed. The tube 6 is inserted into the insulating ring 4 before the device is encased and is thus embedded in the coating 5 when this is applied to the device. It will be understood that the above description of the present invention is susceptible to various modifications, changes and adaptations, and the same are intended to be comprehended within the meaning and range of equivalents of the appended claims.

We claim:
1. In a high output semiconductor device which is tightly encased in a plastic coating, said device including a wafer-shaped semiconductor body having electrodes at its opposed major surfaces, two cylindrical metal bodies serving as current connecting means and as means for dissipating heat contacting said electrodes of said semiconductor body at said respective major surfaces, a hollow cylindrical insulating ring which encloses and centers said metal bodies and said semiconductor body, and a pair of annular sheet metal strips each connecting one of said metal bodies to said plastic jacket so as to seal said semiconductor body; the improvement wherein: said pair of annular sheet metal strips each has a dished portion adjacent its inner periphery; the inner periphery of each of said strips is fastened to the superficies of a respective one of said two metal bodies with said dished portions enclosing the respective edge surfaces of said insulating ring while leaving an air gap therebetween; said insulating ring is formed of an insulating material which does not adhere to said metal bodies or said metal strips and which has a high softening temperature; and the outer periphery of said annular strips is rigidly embedded in said plastic coating which has been produced by encasing or spraying under pressure around the outer surface of said insulating ring.

2. A semiconductor device as defined in claim 1 wherein said plastic coating which tightly encloses the semiconductor device is made of epoxy resin.

3. A semiconductor device as defined in claim 1 wherein said plastic coating is made of a pressed silicone mass.

4. A semiconductor device as defined in claim 1 wherein said insulating ring is made of a glass fiber reinforced epoxy mass.

5. A semiconductor device as defined in claim 1 wherein said insulating ring is formed of a plastic material which has a softening temperature greater than the temperature at which the material of said plastic coating becomes liquid.

6. A semiconductor device as defined in claim 1 wherein said sheet metal strips are made of copper.

* * * * *